US00RE42138E

(19) United States
(12) Reissued Patent
Lee et al.

(10) Patent Number: US RE42,138 E
(45) Date of Reissued Patent: Feb. 15, 2011

(54) THIN FILM TRANSISTORS FOR LIQUID CRYSTAL DISPLAYS

(75) Inventors: Joo-Hyung Lee, Seoul (KR); Jae-Ho Huh, Seoul (KR); Dong-Gyu Kim, Kyungki-do (KR)

(73) Assignee: Samsung Electronics Co., Ltd. (KR)

(21) Appl. No.: 10/639,789

(22) Filed: Aug. 13, 2003

Related U.S. Patent Documents

Reissue of:
(64) Patent No.: 6,274,884
Issued: Aug. 14, 2001
Appl. No.: 09/092,120
Filed: Jun. 5, 1998

U.S. Applications:

(63) Continuation-in-part of application No. 08/686,952, filed on Jul. 26, 1996, now Pat. No. 5,877,512.

(30) Foreign Application Priority Data

Oct. 27, 1997 (KR) ..... 97-53472

(51) Int. Cl.
*H01L 31/00* (2006.01)

(52) U.S. Cl. ..... 257/57; 257/59
(58) Field of Classification Search ..... 438/158, 438/159; 257/57, 59, 66, 72, 347, 401
See application file for complete search history.

(56) References Cited

U.S. PATENT DOCUMENTS 4,990,981 A 2/1991 Tanaka et al.
5,049,952 A 9/1991 Choi
5,055,899 A 10/1991 Wakai et al.
5,173,753 A * 12/1992 Wu ..... 257/347
5,877,512 A 3/1999 Kim
5,883,437 A 3/1999 Maruyama et al.
6,075,257 A * 6/2000 Song ..... 257/59
6,140,668 A * 10/2000 Mei et al. ..... 257/66
6,274,884 B1 * 8/2001 Lee et al. ..... 257/57

FOREIGN PATENT DOCUMENTS

JP 05-136419 6/1993
JP 06-090001 3/1994
KR 10-1997-0007432 2/1997
KR 018532 12/1998

* cited by examiner

*Primary Examiner*—Mark Prenty
(74) *Attorney, Agent, or Firm*—Innovation Counsel LLP

(57) ABSTRACT

The amorphous silicon layer overlaps the gate electrode and the edges of the amorphous silicon layer are substantially encompassed by the edges of the gate electrode. The distance between the edges is at least 2 microns. Accordingly, both the light obliquely incident on the amorphous silicon layer from the outside once the light normally incident on the amorphous silicon layer is blocked by the gate electrode. Insulation layers, which are separated from the amorphous silicon layer and made of an amorphous silicon, are interposed between the edges of the source/drain electrodes and the gate electrode to reinforce the insulation between the gate electrode and the source/drain electrodes and also to absorb the light reflected by the source/drain electrodes and the gate electrode. The source electrode may partially surround the drain electrode in annular shape, to reduce the parasitic capacitance generated between the gate electrode and the drain electrode. The amorphous silicon layer may protrude out the gate electrode near the edges of the gate electrode which encompasses a source electrode and the source/drain electrodes. The amorphous silicon layer covers the edges of the gate electrode which encompasses the source electrode. The source electrode may be curved to prolong the distance between the drain electrode and the portion of the amorphous silicon layer.

46 Claims, 13 Drawing Sheets

FIG.5A AMENDED
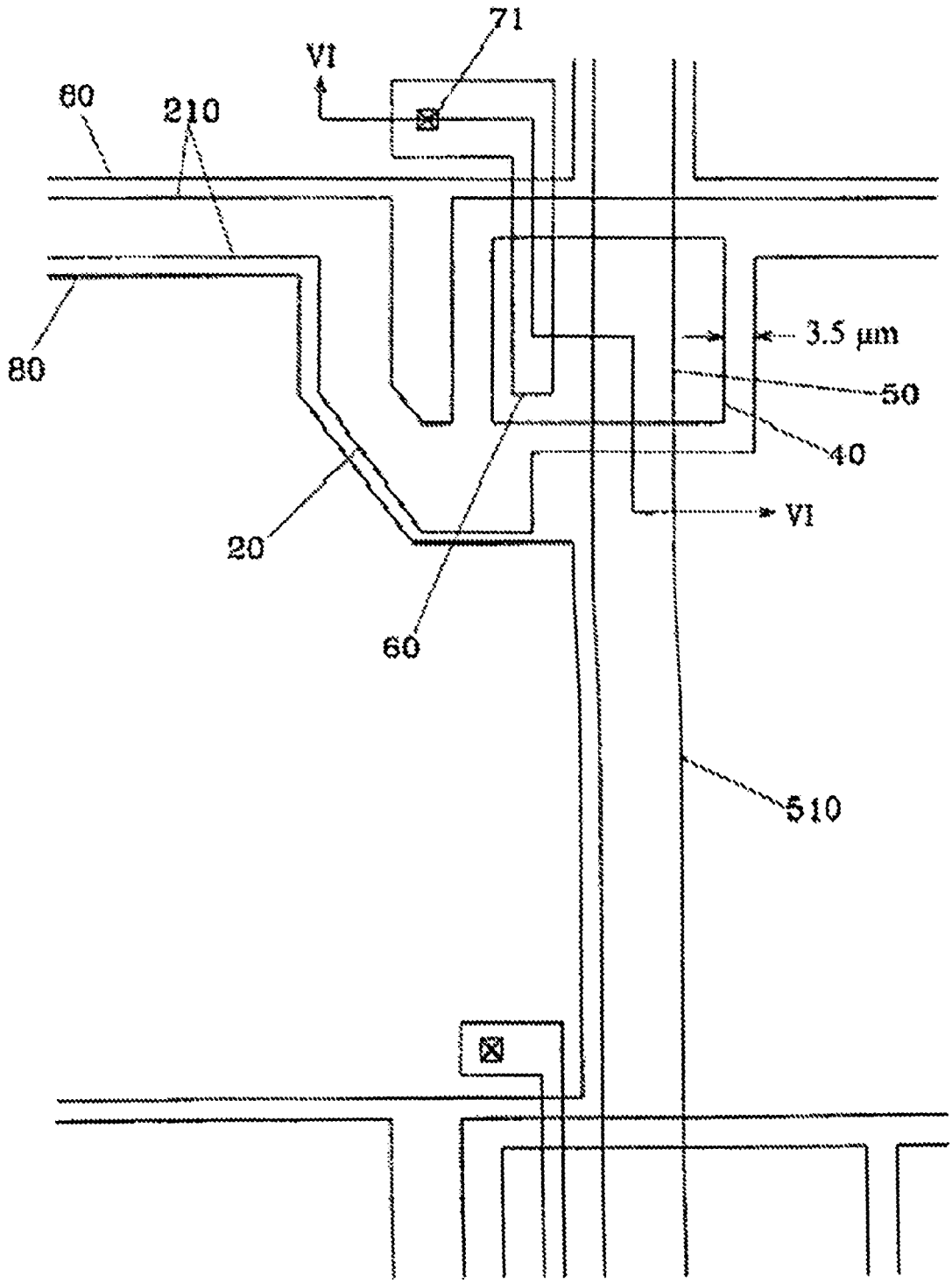

FIG.8 AMENDED
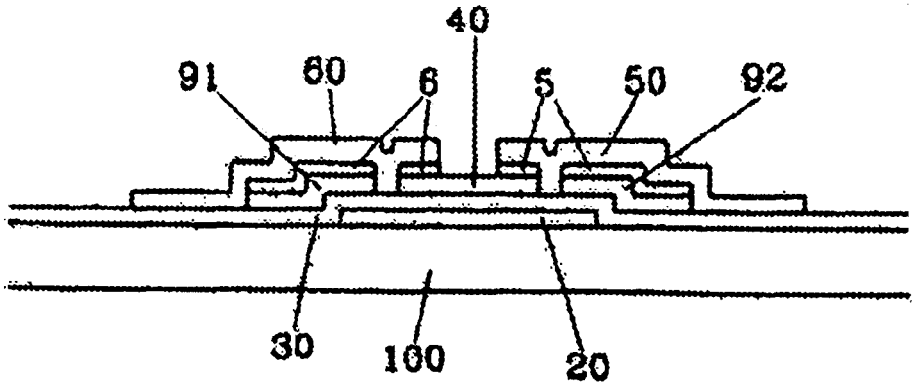

THIN FILM TRANSISTORS FOR LIQUID CRYSTAL DISPLAYS

Matter enclosed in heavy brackets [ ] appears in the original patent but forms no part of this reissue specification; matter printed in italics indicates the additions made by reissue.

REFERENCE TO PRIORITY APPLICATION

[This application is a continuation-in-part of commonly assigned U.S. application Ser. No. 08/,686,952, filed Jul. 26, 1996, now U.S. Pat. No. 5,877,512.] *This application is a reissue of application Ser. No. 09/092,120 filed Jun. 5, 1998 and now U.S. Pat. No. 6,274,884, which is a continuation-in-part of application Ser. No. 08/686,952 filed Jul. 26, 1996 and now U.S. Pat. No. 5,877,512. Notice: More than one reissue application has been filed for the reissue of U.S. Pat. No. 6,274,884. The reissue applications are applications Ser. No. 10/639,789 (the present application) and Ser. No. 11/932,404 (a continuation of the present application).*

BACKGROUND OF THE INVENTION (a) Field of the Invention

The present invention relates to thin film transistors for liquid crystal displays.

(b) Description of the Related Art

Recently, liquid crystal displays (LCDs) using amorphous silicon thin film transistors (hereinafter "TFTs") as switching elements are widely used in notebook personal computers and car navigation systems.

However, photo leakage currents due to the light incident on the amorphous silicon are generated in the thin film transistors, which deteriorate the characteristics of the liquid crystal displays.

A thin film transistor to reduce the photo leakage current is disclosed in U.S. Pat. No. 4,990,981 (Tanaka et al.).

However, the photo leakage currents generated in the amorphous silicon layer may not be considerably reduced in the TFT of Tanaka et al., since the amorphous silicon layer is not completely shielded by the gate electrode from the incident light from the lower side of the substrate.

Furthermore, the gate electrodes and the source/drain electrodes of Tanaka et al. may be easily shorted, since portions of the gate electrodes and the source/drain electrodes overlap via only a single insulating layer. In particular, the insulating layer may be open near the edge of the gate electrode, thereby causing the short between the gate electrodes and the source/drain electrodes.

In the meantime, because the kick-back voltage due to the parasitic capacitances between the gate electrodes and the drain electrodes cause flicker and afterimage etc., it is necessary to reduce the parasitic capacitance.

SUMMARY OF THE INVENTION

It is an object of the present invention to reduce photo leakage currents.

It is another object to reduce the parasitic capacitance between a gate electrode and a drain electrode.

It is another object to prevent the short-circuit between a gate electrode and source and drain electrodes.

A TFT according to the present invention has a gate electrode, an insulator covering the gate electrode, an amorphous silicon layer formed on the insulator, a source electrode which is formed on the amorphous silicon layer and overlaps the gate electrode, and a drain electrode which is formed on the amorphous silicon layer and opposite and separated from the source electrode, and overlaps the gate electrode. Here, the edges of the amorphous silicon layer are substantially encompassed by edges of the gate electrode and the edges of the amorphous silicon layer are spaced apart from the edges of the gate electrode by at least 2 microns.

More desirably, considering a process margin of about 1.5 microns, the edges of the amorphous silicon layer are substantially encompassed by edges of the gate electrode 3.5 microns.

Accordingly, the light obliquely incident on the amorphous silicon layer from the outside as well as the light normally incident on the amorphous silicon layer is blocked by the gate electrode.

It is desirable to add an insulation layers between the gate electrode and the source/drain electrodes to reinforce the insulation between the gate electrode and the source/drain electrodes and to absorb the light reflected by the source/drain electrodes and the gate electrode.

The insulation layers are separated from the amorphous silicon layer made of an amorphous silicon, and interposed between the edges of the source/drain electrodes and the gate electrode.

The source electrode may surround the drain electrode in annular shape, which is symmetrical with respect to a drain electrode to reduce the parasitic capacitance generated between the gate electrode and the drain electrode.

The amorphous silicon layer may extend out the gate electrode near the edges of the gate electrode which encompasses a source electrode and a drain electrode to reinforce the insulation between the gate electrode and the source/drain electrodes, without the insulation layers.

Furthermore, the source electrode may be curved to prolong the distance between the drain electrode and the portion of the amorphous silicon layer, in which the electrons and holes are generated, to minimize the photo currents.

BRIEF DESCRIPTION OF THE DRAWINGS

FIG. 5A is a layout view of a TFT substrate for an LCD according to the first embodiment of the present invention.

FIGS. 7 and 8 are cross-sectional views of the TFTs illustrated in FIGS. 5B and 5C taken along the lines VII—VII and VIII—VIII, respectively.

DETAILED DESCRIPTION OF THE PREFERRED EMBODIMENTS

Figure 1A:
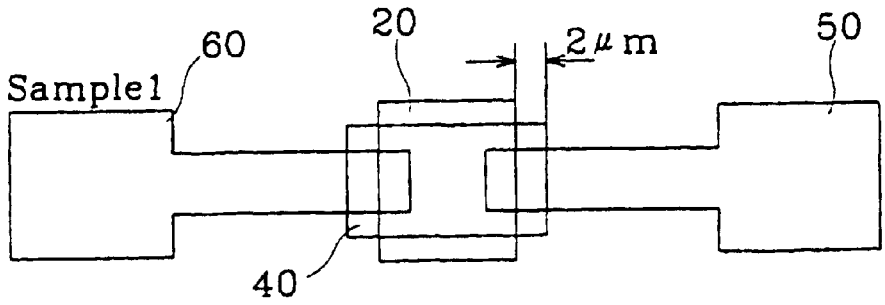
FIGS. 1A~C are layout views of three sample TFTs having amorphous silicon layers with different length.

The present invention will now be described more fully hereinafter with reference to the accompanying drawings, in which preferred embodiments of the present invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the an. In the drawings, the thickness of layers and regions are exaggerated for clarity.

Figure 1B:
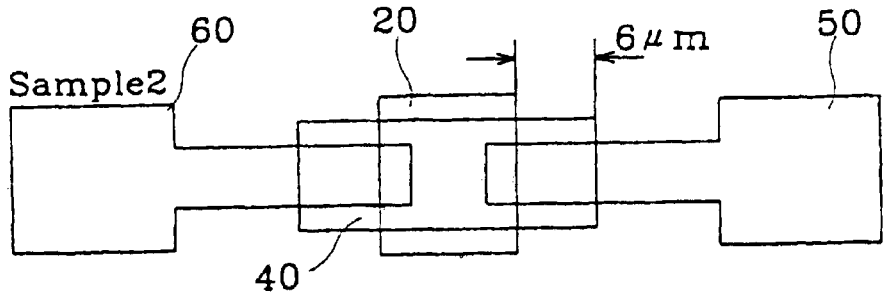
Figure 1C:
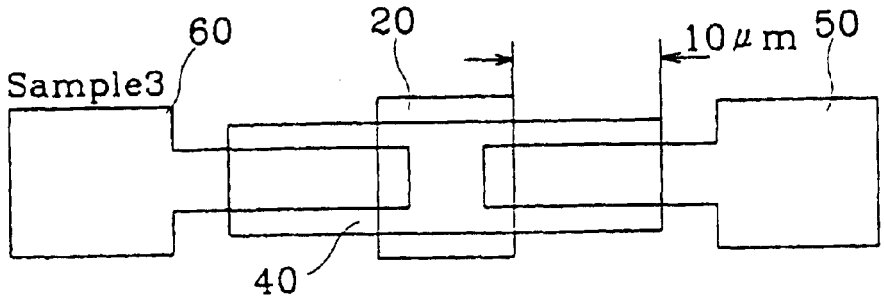
Figure 2:
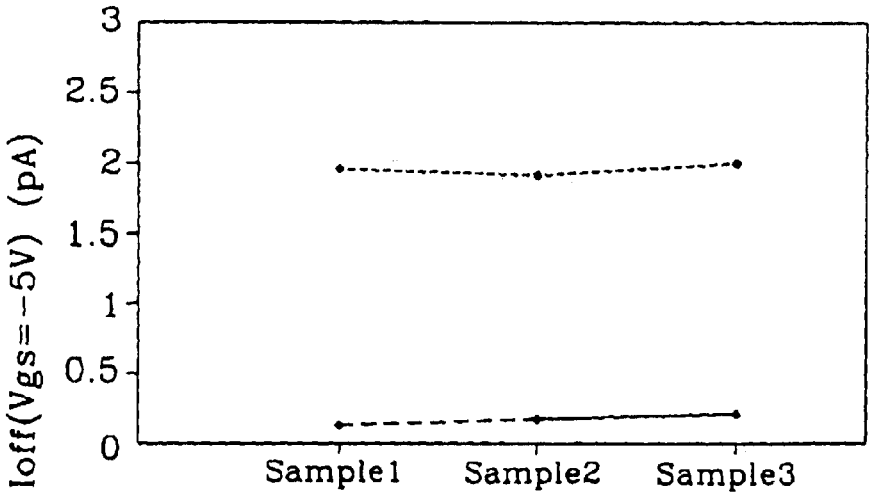
FIG. 2 is a graph showing the OFF currents of the TFTs shown in FIGS. 1A~1C.

FIGS. 1A~1C are layout views of sample TFTs used in the experiments, and FIG. 2 is a graph illustrating the OFF currents for the sample TFTs shown in FIGS. 1A~1C.

As shown in FIGS. 1A~1C, three sample TFTs were prepared. Each TFT has a gate electrode 20, a gate insulating layer (not shown) covering the gate electrode 20, an amorphous silicon layer 40 on the gate insulating layer and a source and a drain electrodes 50 and 60 which formed on the amorphous silicon layer 40 and opposite each other with respect to the gate electrode 20. The length of the amorphous silicon layers 40 which are not shielded by the gate electrode 20 were respectively 2, 6 and 10 microns for the TFTs of FIGS. 1A~1C and, accordingly, the ratio of the area of the amorphous silicon layers 40 which are not shielded by the gate electrode 20 is 1: 3: 5.

The off current loff, i.e., the gate-source current when the gate-source voltage is −5V was measured for each TFT in the photo state and in the dark state. Here, the photo state means the state that a back light giving the luminance of 9,000 cd/$m^2$ is applied. The dark state means the state of a darkroom.

As shown in FIG. 2, the measured OFF current of each TFT is nearly constant for the photo state and the dark state, respectively.

Thus, the area of the portions of the amorphous silicon layer 40 which protrudes out of the gate electrode 20 hardly contribute to the photo leakage current.

Figure 3A:
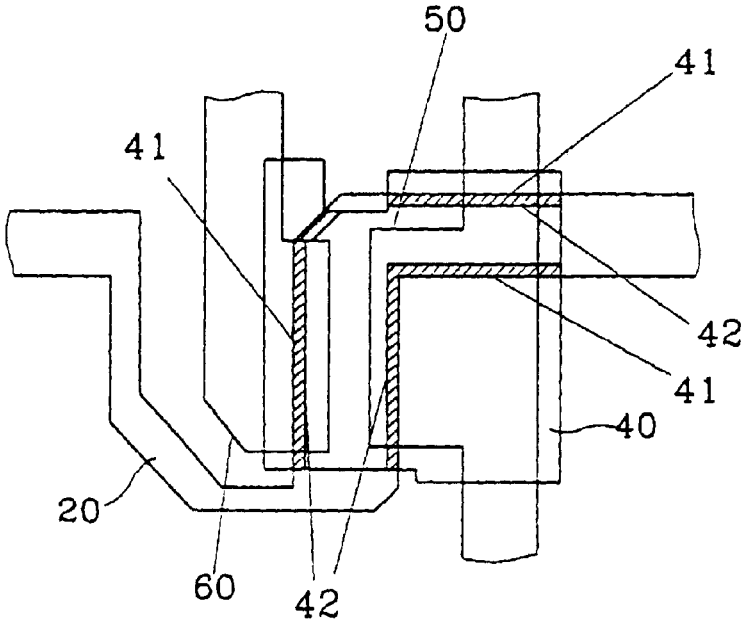
FIGS. 3A~3C are layout views of other three sample TFTs having different overlapping areas of a gate electrode and source/drain electrodes.
Figure 3B:
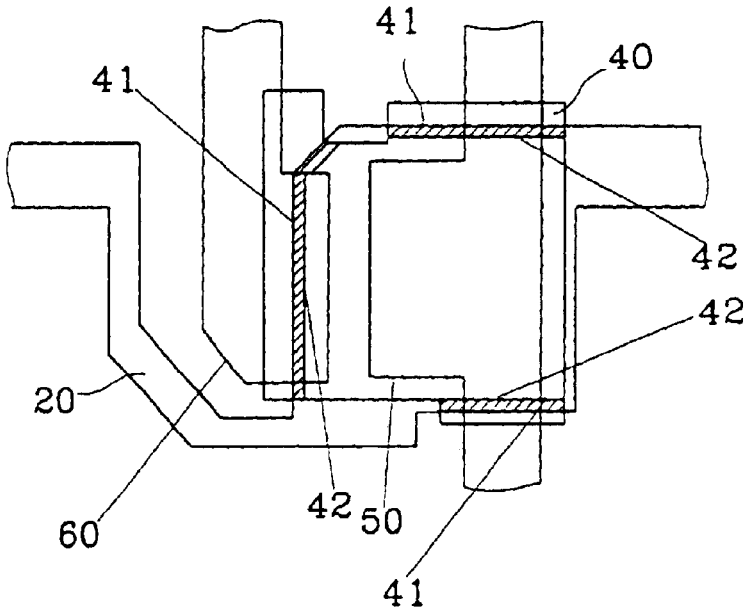
Figure 3C:
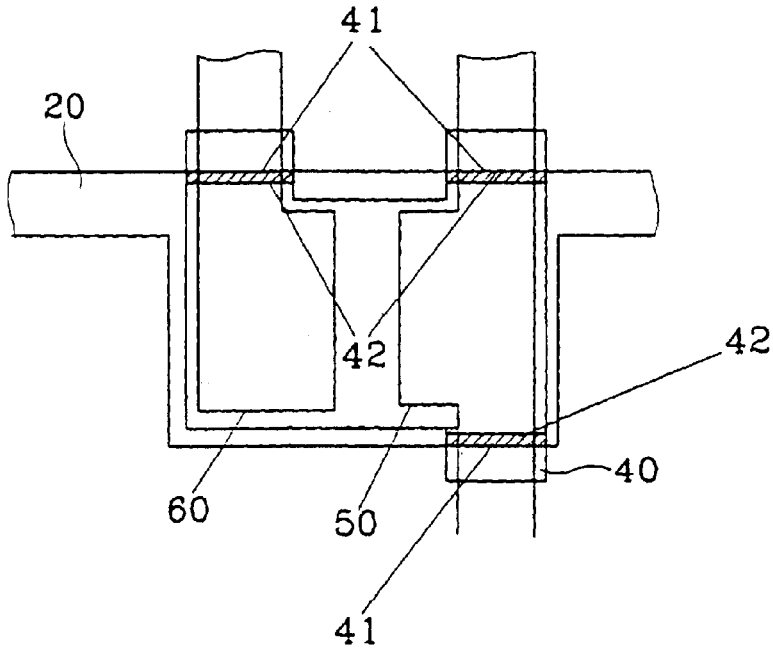

FIGS. 3A~3C are layout views of other three samples of TFTs.

As shown in FIGS. 3A~3C, each TFT has a gate electrode 20, a gate insulating layer (not shown) covering the gate electrode 20, an amorphous silicon layer 40 on the gate insulating layer and a source and a drain electrodes 50 and 60 which are formed on the amorphous silicon layer 40 and opposite each other with respect to the gate electrode 20. Here, the patterns of the amorphous silicon layers 40 and of the source/drain electrodes 50 and 60 are the same, and the patterns of gate electrodes 20 are different for each of the respective TFTs. Portions of the edges of the gate electrode 20 are enclosed by the edges of the amorphous silicon layer 40. The amorphous silicon layer 40 covers most of the edges of the gate electrode 20 of the TFT shown in FIG. 3A, while the amorphous silicon layer 40 covers only small portions of the edges of the gate electrode 20 of the TFT shown in FIG. 3B. On the contrary, most of the edges of the amorphous silicon layer 40 is encompassed by the edges of the gate electrode 20 of the TFT shown in FIG. 3C. The hatched regions in FIGS. 3A~3C indicate the portions of the amorphous silicon layer 40, which overlap the gate electrode 20 and lie between the edge lines 41 of the gate electrode 20 located in the amorphous silicon layer 40 and the lines 42 spaced apart from the edge lines 41 by 2 microns.

The drain-source current Ids was measured for the cases that the gate source voltages Vgs and the drain-source voltages Vds were −5V and 10V, −5V and 4V, −8V and 10V, and −8V and 4V, respectively, and the ratio of the hatched region is 71.5: 50: 32.

Figure 4:
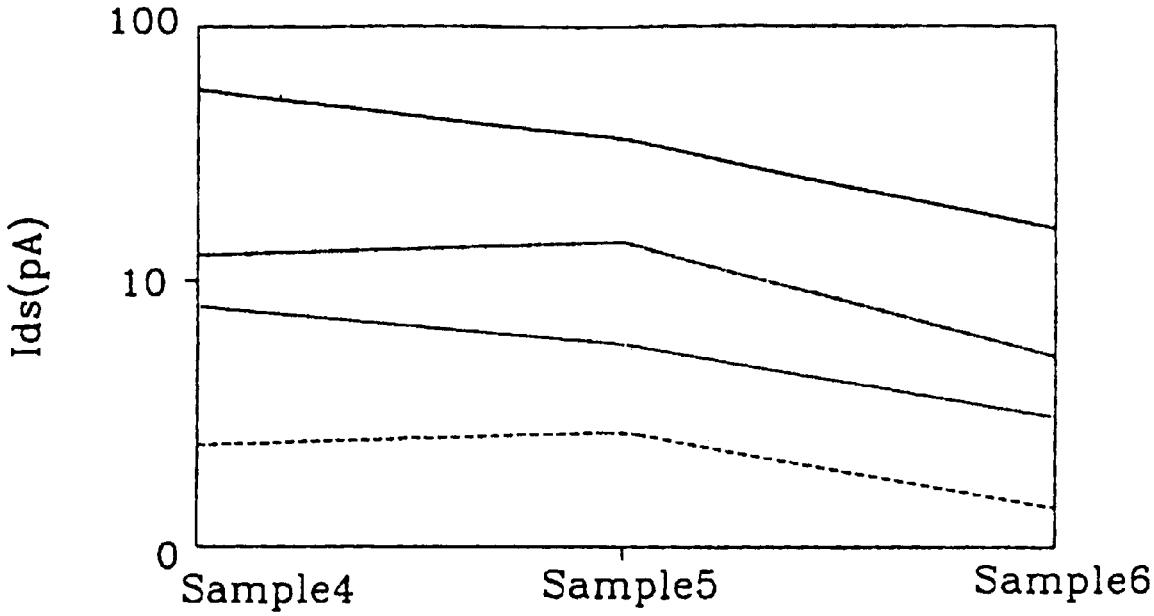
FIG. 4 shows the current characteristics of the TFTs shown in FIGS. 3A~3C.

As shown in FIG. 4, the drain-source current of each TFT is nearly proportional to the area of the hatched region. For example, the drain-source currents of the sample TFTs in case of Vgs=−5V and Vds=10V are 47.3 pA, 24.5 pA and 15 pA, respectively, and their drain-source currents in case of Vgs=−8V and Vds=10V are 8.4 pA, 5.5 pA and 3.3 pA, respectively. These ratio of the drain-source currents for the TFTs are similar to the ratio of the areas of the hatched regions.

Accordingly, it is desirable that the edges of the amorphous silicon layer 40 are substantially encompassed by the edges of the gate electrode 20 and the distance between their edges are at least 2 microns.

Figure 5B:
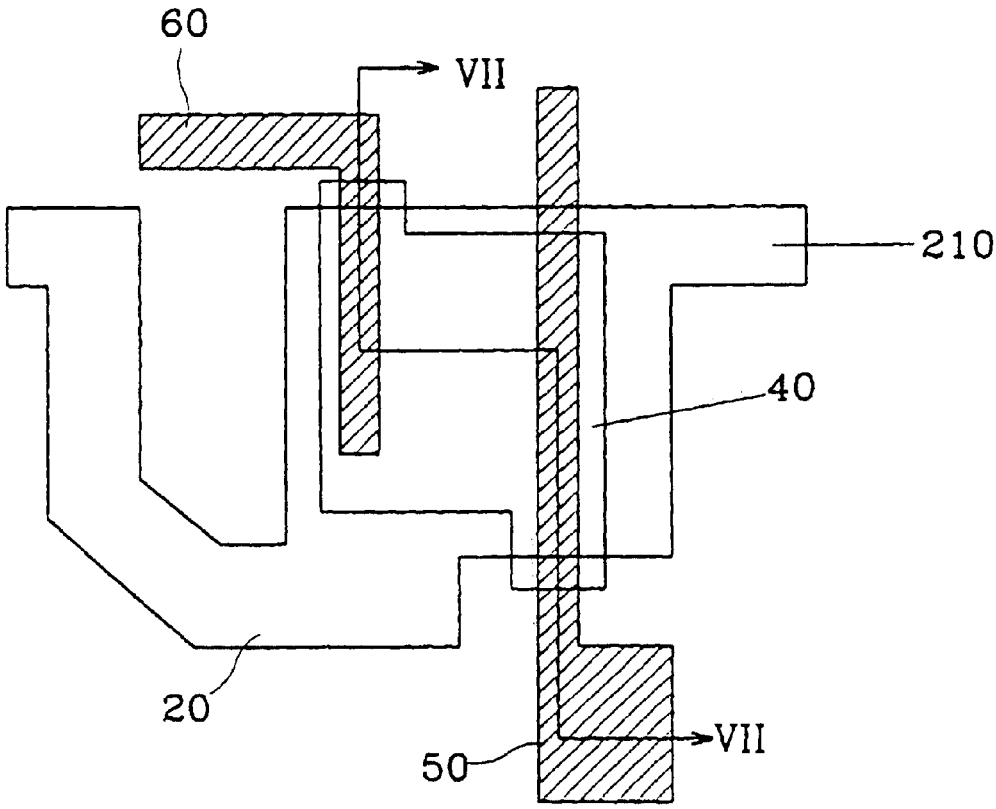
FIGS. 5B and 5C are layout views of TFTs according to the second and the third embodiments of the present invention, respectively.
Figure 6:
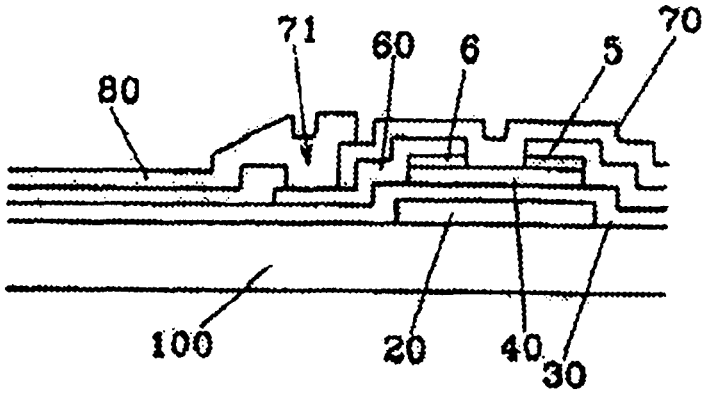
FIG. 6 is a cross-sectional view of the TFT substrate illustrated in FIG. 5A taken along the line VI—VI.

FIG. 5A is a layout view of a TFT substrate for an LCD according to the first embodiment of the present invention, and FIG. 6 shows a cross-sectional view of the TFT substrate illustrated in FIG. 5A taken along the line VI—VI.

A gate pattern consisting of a gate line 210 including a gate electrode 20 is formed in transverse direction on a substrate 100. A gate insulating layer 300 covers the gate pattern 210 and 20. A hydrogenated amorphous silicon (a-si:H) layer 40 and a doped hydrogenated amorphous silicon layer 5 and 6 with N type impurity are sequentially formed on the portion of the gate insulating layer 30 above the gate electrode 20, and the portions 5 and 6 of the doped amorphous silicon layer are separated from each other and opposite each other with respect the gate electrode 20. Here, the amorphous silicon layer 40 is used as a channel layer of TFT, and the doped amorphous silicon layer 5 and 6 is used as a contact resistance layer to decrease the contact resistance between the amorphous silicon layer 40 and metal electrodes.

A data line 510 defining a pixel region P along with the gate line 210 is formed on the gate insulating layer 30, a source electrode 50 which is a portion of the data line 510 is formed on the one portion 5 of the doped amorphous silicon layer, and a drain electrode 60 opposite the source electrode 50 with respect to the gate electrode 20 and parallel to the source electrode 50 is formed on the other portion 6 of the doped amorphous silicon layer.

A passivation layer 70 is formed on the data pattern 510, 50 and 60 and portions of the amorphous silicon layer 40 which are not covered by the data pattern 510, 50 and 60. The passivation layer 70 has a contact hole 71 exposing the drain electrode 60.

Finally, a pixel electrode 80 made of transparent conductive material such as ITO (indium tin oxide) and connected to the drain electrode 60 through the contact hole 71 is formed on the passivation layer 70 in the pixel region P.

The edges of the amorphous silicon layer 40 are substantially encompassed by the edges of the gate electrode 20 and the distance between their edges are at least 2 microns. Accordingly, the light obliquely incident on the amorphous silicon layer 40 from the outside as well as the light normally incident on the amorphous silicon layer 40 is blocked by the gate electrode 20. Considering the process margin of 1.5 microns, it is much desirable that the distance between the edges of the gate electrode 20 and of the amorphous silicon layer 40 are at least 3.5 microns.

However, the gate electrode 20 and the source/drain electrodes 50 and 60 may be shorted, since some portions of the gate electrode 20 and the source/drain electrodes 50 and 60 overlap via only the gate insulating layer 30 as shown in FIGS. 5A and 6. In particular, the gate insulating layer 30 is apt to be opened near the edge of the gate insulating layer 30, thereby causing the short between the gate electrode 20 and the source/drain electrodes 50 and 60. Furthermore, the light from the outside may be reflected by the source/drain electrodes 50 and 60 and the gate electrode 20 in sequence to enter the amorphous silicon layer 40

Accordingly, a structure to reduce these problems will be described through the following embodiments.

The structure of only a TFT not overall the pixel will be described in the following embodiments, and the structure of whole pixel may be the similar to that of FIGS. 5A and 6.

Figure 7:
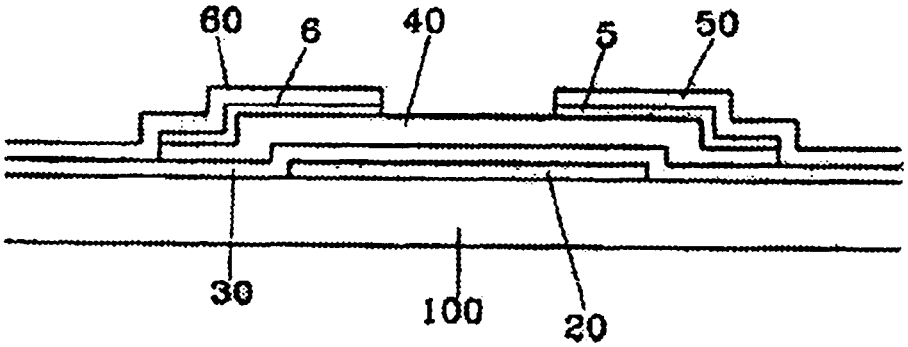

FIG. 5B is a layout view of a TFT according to the second embodiment of the present invention, and FIG. 7 shows a cross-sectional view of the TFT illustrated in FIG. 5B taken along the line VII—VII.

The structure of the TFT is similar to that shown in FIGS. 5A and 6, but portions of the amorphous silicon layer 40 extend to cover the edges of the gate electrode 20, which are substantially encompassed by the edges of the source/drain electrodes 50 and 60 to reinforce the insulation between the gate electrode 20 and the source/drain electrodes 50 and 60, thereby preventing the short-circuit thereof.

However, the photo leakage current may be generated in the extended portion of the amorphous silicon layer 40.

The structure to solve this problem is proposed through a third embodiment.

Figure 5C:
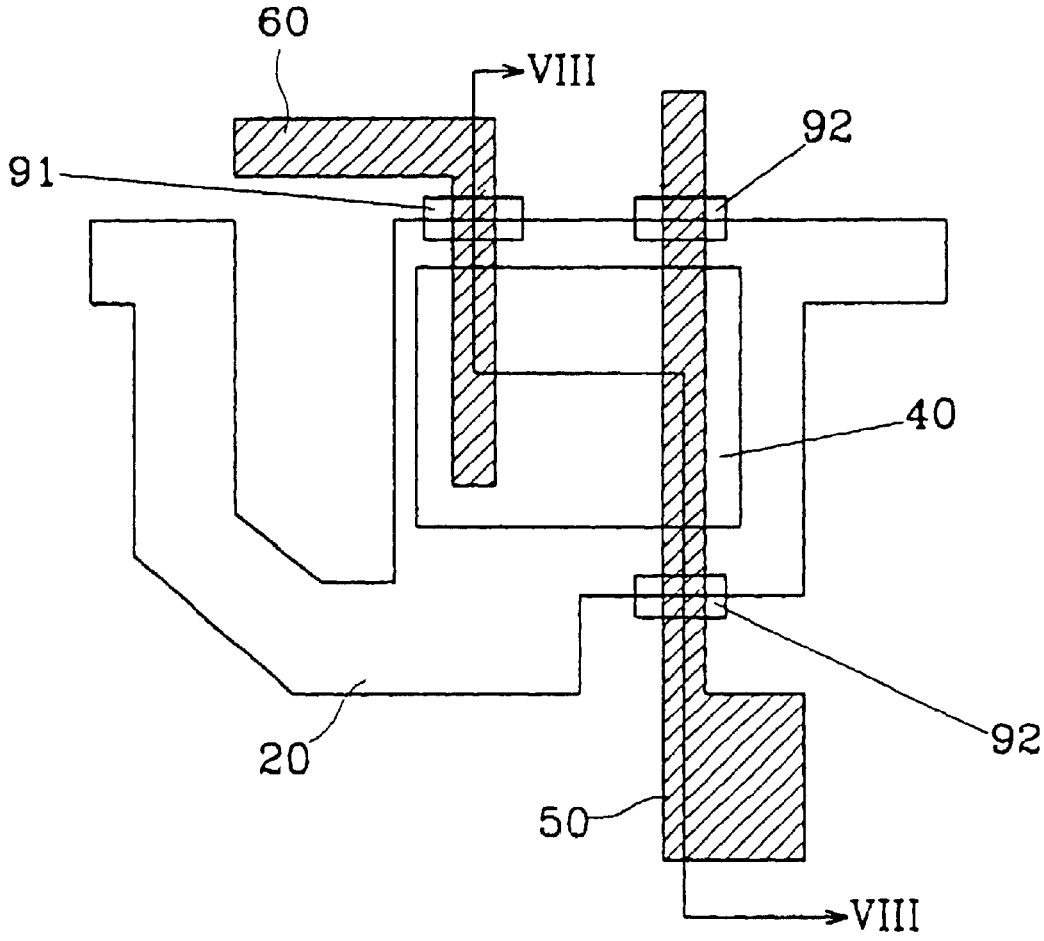

FIG. 5C is a layout view of a TFT according to the third embodiment of the present invention, and FIG. 8 shows a cross-sectional view of the TFT illustrated in FIG. 5C taken along the line VIII—VIII.

As shown in FIGS. 5C and 8, the structure of the TFT is almost the same as that in FIGS. 5A and 6.

However, insulation layers 91 and 92 is separated from the amorphous silicon layer 40 are interposed between the source/drain electrodes 50 and 60 and the edges of the gate electrode 20 in order to reinforce the insulation between the gate electrode 20 and the source/drain electrodes 50 and 60. The insulation layers 91 and 92 are preferably made of insulating materials which absorb the light incident from the outside of the gate electrode 20, such as amorphous silicon. The light reflected by the source/drain electrodes 50 and 60 and the gate electrode 20 is also preferably absorbed by the insulation layers 91 and 92.

Figure 9:
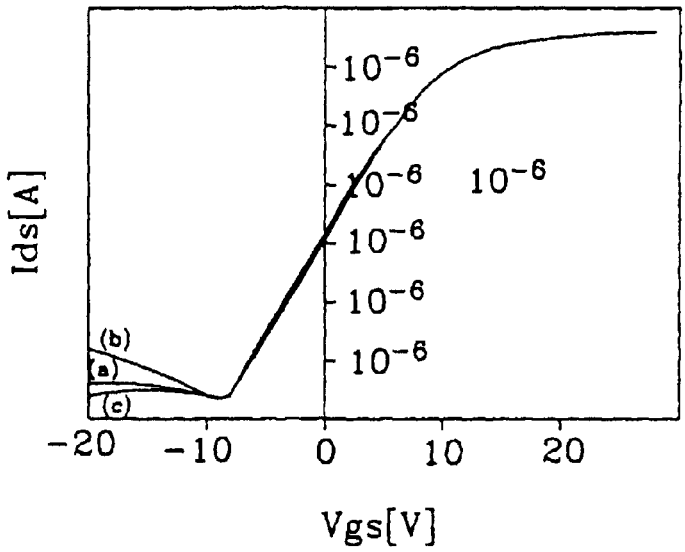
FIG. 9 is a graph showing the current characteristics of the TFTs illustrated in FIGS. 5A~5C.

FIG. 9 is a graph showing current characteristics of the TFTs in FIGS. 5A~5C.

The curves (a), (b) and (c) in FIG. 9 show the drain-source currents Ids of the TFTs illustrated in FIGS. 5A, 5B and 5C, respectively, as a function of the gate-source voltages Vgs. Referring to FIG. 9, the drain current Ids of (b) is considerably larger than those of (a) and (c), and the drain current Ids of (a) is somewhat larger than that of (c) by the range of −20~0V of Vgs.

This results indicates that the TFT in FIG. 5C is superior to those in FIGS. 5A and 5C.

Figure 10:
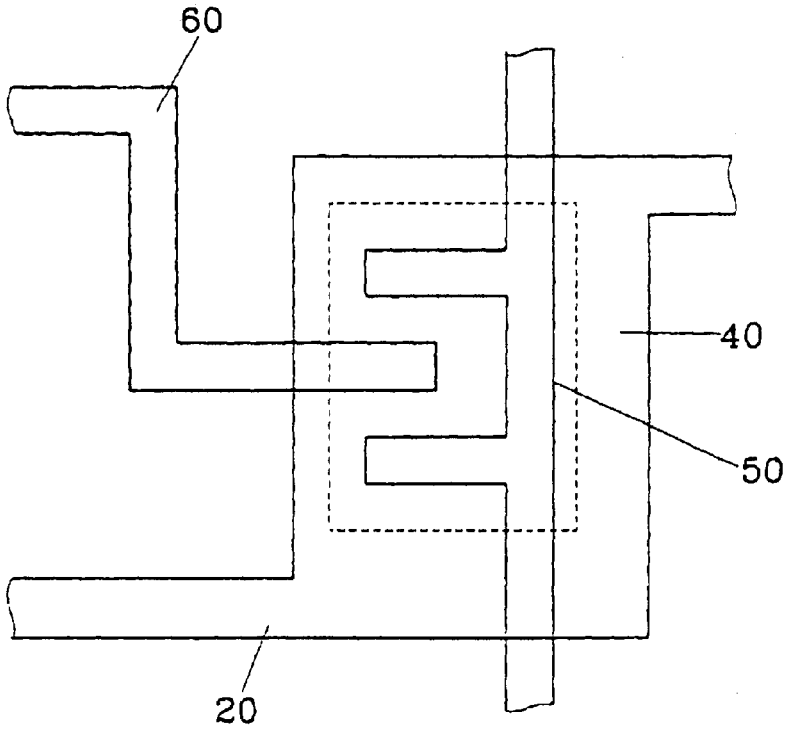
FIGS. 10~17 are layout views of TFTs according to the fourth to eleventh embodiments of the present invention.
Figure 11:
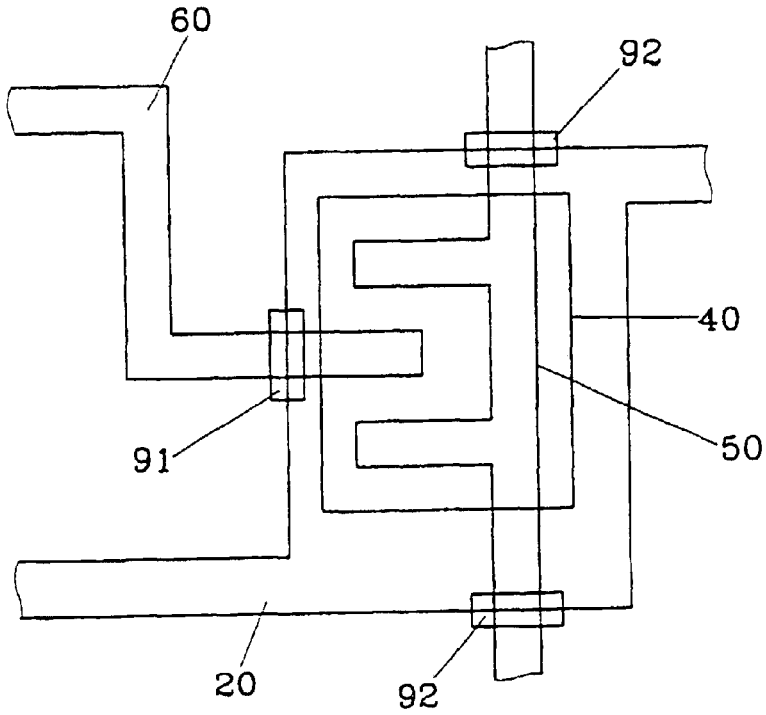
Figure 12:
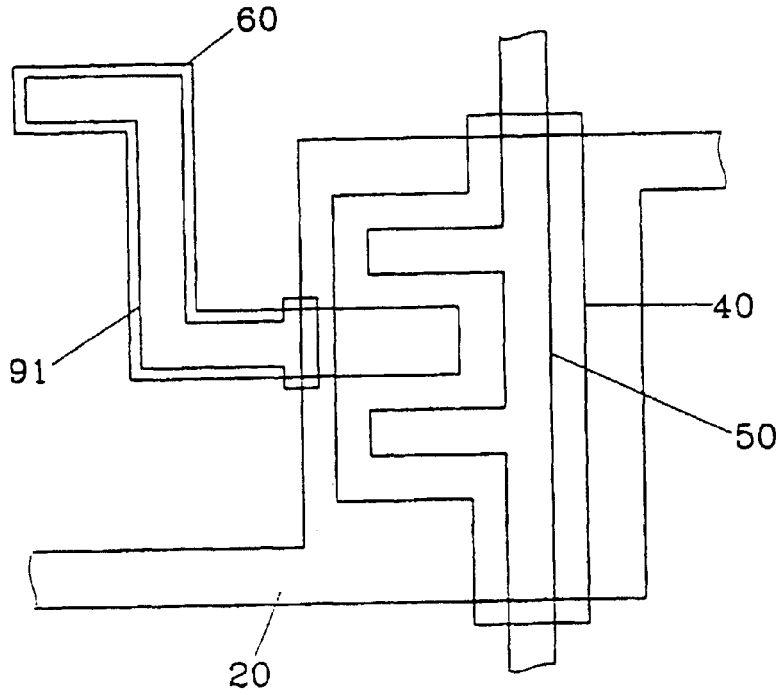

FIGS. 10~12 are layout views of TFTs according to the fourth to sixth embodiments of the present invention.

As shown in FIG. 10, the edges of an amorphous silicon layer 40 are enclosed by the edges of a gate electrode 20 as in the first embodiment.

As shown in FIG. 11, the edges of an amorphous silicon layer 40 are enclosed by the edges of a gate electrode 20, and insulation layers 91 and 92 separated from the amorphous silicon layer 40 are interposed between the source/drain electrodes 50 and 60 and the edges of the gate electrode 20, as in the third embodiment.

As shown in FIG. 12, the edges of an amorphous silicon layer 40 are substantially enclosed by the edges of a gate electrode 20, and the amorphous silicon layer 40 extends to cover the edges of the gate electrode 20 encompassed by the edges of the source electrode 50 as in the second embodiment. An insulation layer 91 separated from the amorphous silicon layer 40 is formed to cover the edge of the gate electrode 20, which meet the drain electrodes 60. The insulation layer 91 extends along the drain electrode 60 and is almost encompassed by the edges of the drain electrode 60. Here, the amorphous silicon layer 40 may be connected to the insulation layer 91.

A source electrode 50 of each TFT according to the fourth to the sixth embodiments partially surrounds the drain electrode in annular shape, which is symmetrical with respect to a drain electrode 60.

Since the source electrode 50 is formed in annular shape in this way and thus the edges of the source electrode 50 facing the drain electrode 60 is long, the size of the drain electrode 60 for obtaining a conduction channel of a limited size may be reduced in comparison with the previous embodiments. Accordingly, the overlapping area between the gate electrode 20 and the drain electrode 60 may be reduced, and the parasitic capacitance generated between the gate electrode 20 and the drain electrode 60 may be also reduced. Furthermore, the variation of the parasitic capacitance due to misalignment is small, as a result, the deviation of flicker become small in display.

Next, the various modifications of the TFTs shown in FIGS. 13~16 will be described. These modifications have extended portions of the amorphous silicon layer to reinforce the insulation between the gate electrode and the source/drain electrodes and, have the structures for minimizing the photo currents.

As shown in FIGS. 13 to 16, an amorphous silicon layer 40 is formed almost within a gate electrode 20. That is, the edges of the amorphous silicon layer 40 are encompassed by the edges of the gate electrode 20. However, the amorphous silicon layer 40 protrudes out of the gate electrode 20 near the edges of the gate electrode 20 which encompasses a source electrode 50 and near a drain electrode 60. In detail, the amorphous silicon layer 40 as well as a gate insulating layer (not shown) is interposed between the gate and the source electrodes 20 and 50. In particular, the amorphous silicon layer 40 covers the edges of the gate electrode 20 which encompasses the source electrode 50, and the edges of the source electrode 50 which encompasses the gate electrode 20 is encompassed by the edges of the amorphous silicon layer 40. Therefore, there are some portions C1 and C2 which overlap neither the gate electrode 20 nor the source electrode 50 near the intersections of the edges lines of the gate and the source electrodes 20 and 50.

Figure 13:
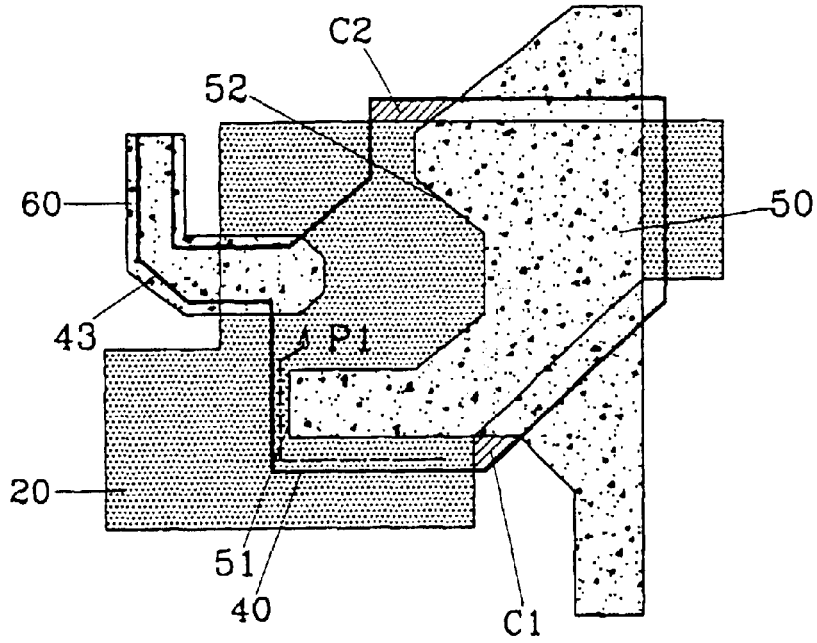
Figure 14:
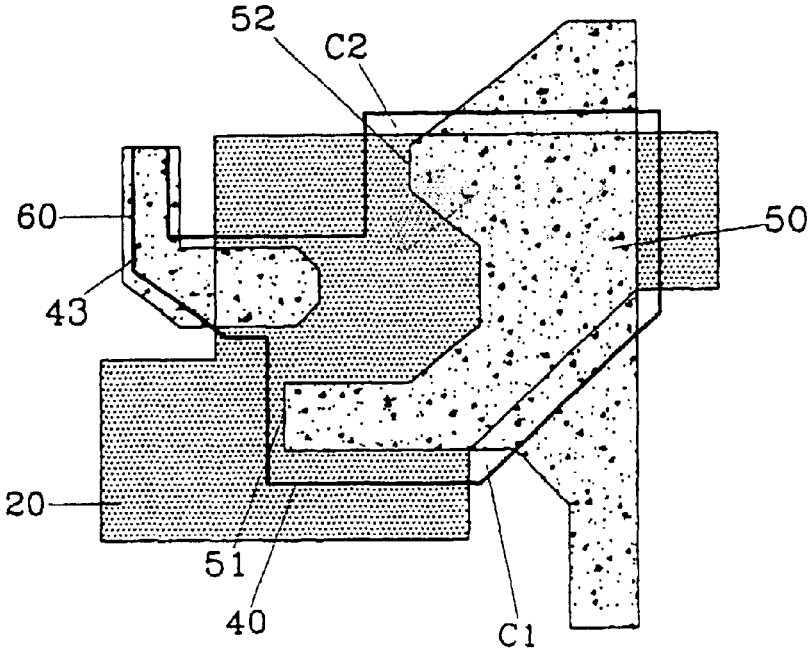

As shown in FIGS. 13 and 14, an end portion 51 and 52 of the source electrode 50 near the portions C1 and C2 of the amorphous silicon layer 40 extend toward the drain electrode 60 and partially surrounds the drain electrode 60 in annular shape, such that the path P1 through which the electrons and holes generated in the portion C1 arrive at the drain electrode 60 is prolonged.

Accordingly, the electrons and holes generated in the portion C1 appear not to contribute to the photo leakage current. If the other end portion 52 of the source electrode 50 is formed in the same manner as in FIG. 12, the photo leakage current is greatly reduced. However, in these embodiments, considering etch or alignment problem which may be generated in the manufacturing process, only one end portion 51 of the source electrode 50 elongated as shown in FIGS. 13 and 14. The other end portion 52 of the source electrode 50 is protruded a little to enlarge the conduction channel.

In the mean time, the amorphous silicon layer 40 extends along the drain electrode 60 to form a portion 43 overlapping only the drain electrode 60 not the gate electrode 20.

The portion 43 in FIG. 13 lies within the boundary of the drain electrode 60, such that the area of the portion 43 is small to reduce the number of generated electrons and holes. Even though the electrons and holes are generated in the portion 43, since they flow into the drain electrode 60, they hardly contribute to the photo leakage current. However, the portion 43 of the amorphous silicon layer 40 may be isolated as in the sixth embodiment shown FIG. 12 in order to further reduce the photo leakage current.

However, in FIG. 14, the amorphous silicon layer 40 is interposed between the drain electrode 60 and the gate electrode 20 at all positions. In particular, the amorphous silicon layer 40 lies between the drain electrode 60 and the edges of the gate electrode 20, which encompasses the drain electrode 60. The structure may prevent the short-circuit of the drain electrode 60 and the gate electrode 20 near the edges of the amorphous silicon layer 40, and the parasitic capacitance generated between the gate electrode 20 and the drain electrode 60 may be reduced, due to the thickness of the dielectrics of the gate insulating layer and the amorphous silicon layer therebetween.

Figure 15:
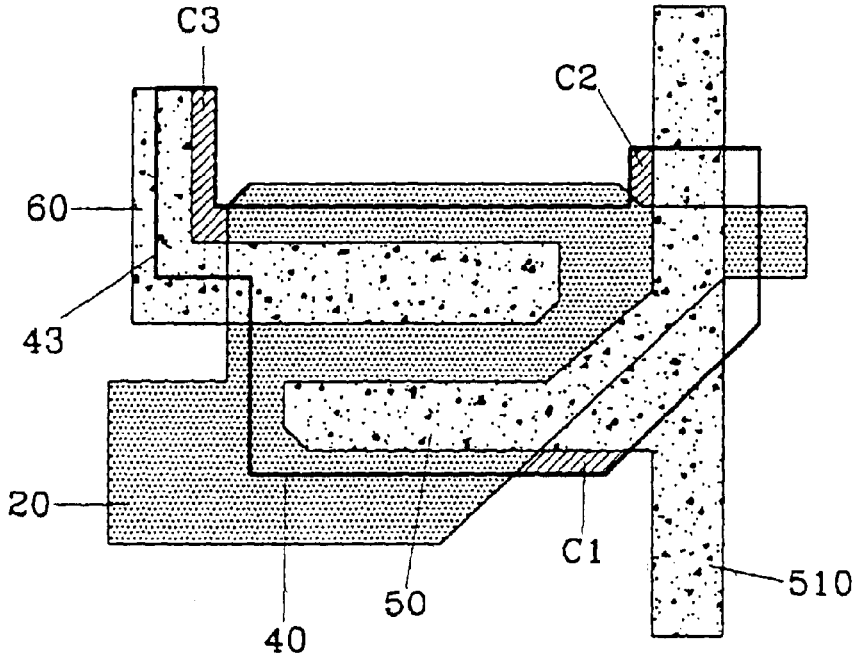
Figure 16:
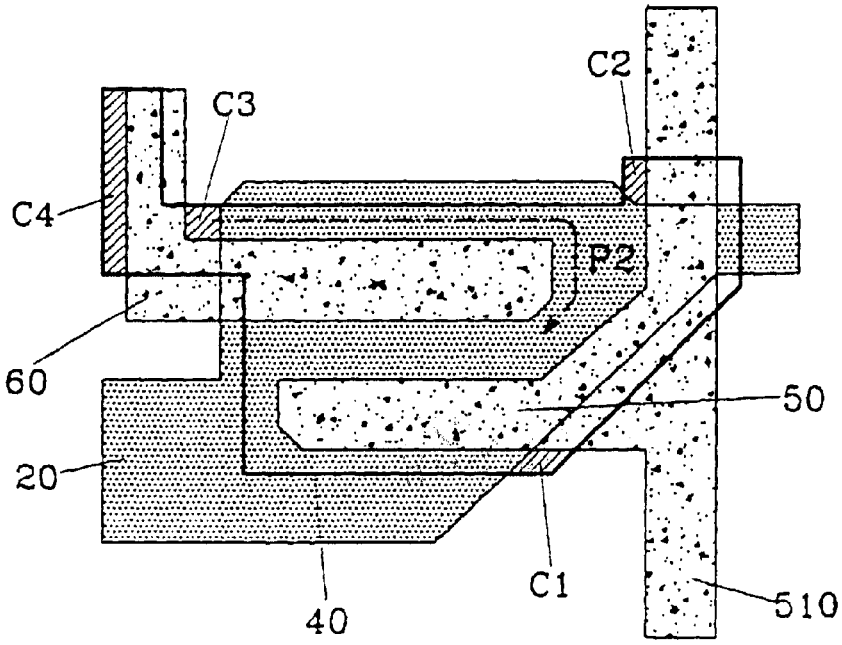

As shown in FIGS. 15 and 16, the source and the drain electrodes 50 and 60 extend toward each other in the transverse direction, such that the path which the electrons and holes generated in the portion C1 arrive at the drain electrode 60 is prolonged as in the seven embodiment. Accordingly, the electrons and holes generated in the portion C1 hardly contribute to the photo leakage current.

In addition, because the source and the drain electrodes 50 and 60 extend in the transverse direction, the channels of the TFTs is formed under the drain electrode 60, such that the path which the electrons and holes generated in the portion C2 arrive at the channels is prolonged. Accordingly, the electrons and holes generated in the portion C2 hardly contribute to the photo leakage current, too.

The amorphous silicon layer 40 may have portions C3 and C4 which overlap neither the gate electrode 20 nor the drain electrode 60 near the drain electrode 60 due to the limit of design rule as shown in FIGS. 15 and 16. However, since the portions C3 and C4 are far from the channel of the TFT, the portions C3 and C4 may not influence on the photo leakage current.

As shown in FIG. 16, the charge carriers which are generated in the portion C3 adjacent to the gate electrode 20 may directly arrive at the channel of the TFT through the path P2, while the carriers which are generated in the portion C4 separated from the gate electrode 20 may be absorbed by the drain electrode 60. Accordingly, if the amorphous silicon layer 40 and the drain electrode 60 are aligned such that the area of the portion C4 is much larger than that of the portion C3, the photo leakage current may be much reduced.

Figure 17:
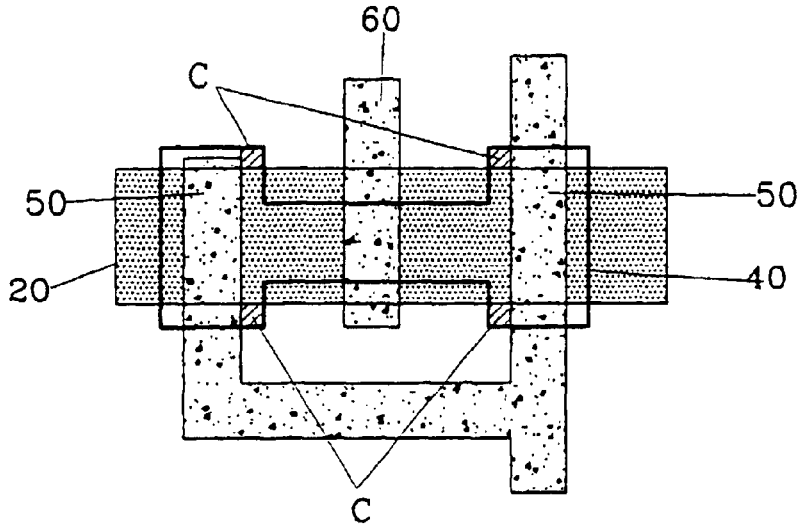

FIG. 17 is layout view of a TFT having two channels according to another embodiment of the present invention.

As shown in FIG. 17, the edges of an amorphous silicon layer 40 are substantially enclosed by a gate electrode 20, except for the edges of the gate electrode 20 which meet a source electrode 50. In order to reinforce the insulation between the gate electrode 20 and the source electrode 50, the amorphous silicon layer 40 extends to cover the edges of the gate electrode 20 which meet the source electrode 50, and thus some portions C of the amorphous silicon layer 40 overlap neither the source electrode 50 and the gate electrode 20. However, the amorphous silicon layer 40 do not cover the edges of the gate electrode 20 which meet the drain electrode 60. Accordingly, the area of the portions C may be reduced, and the length of the edges of the amorphous silicon layer 40 between the portions C are the drain electrode 60 is relatively long, thereby reducing the photo leakage current.

Figure 18:
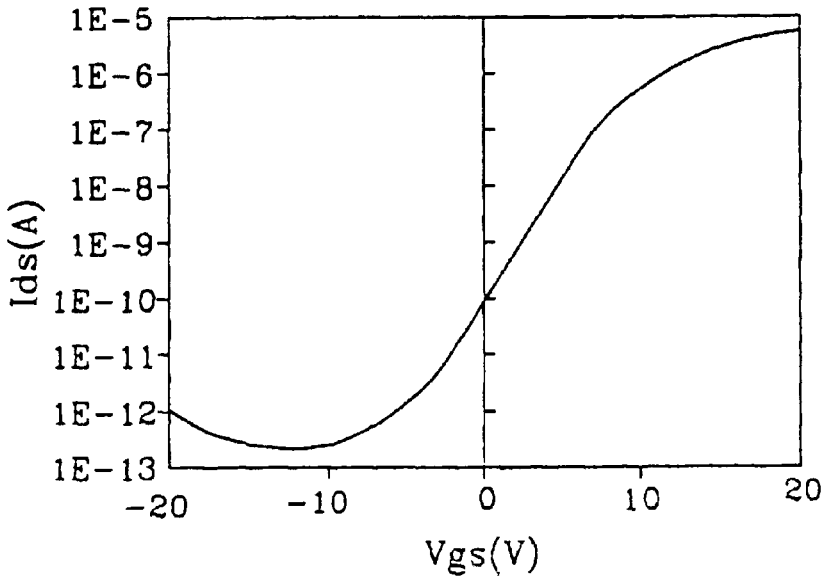
FIG. 18 is a graph showing the voltage-current characteristic of the TFT illustrated in FIG. 13.

FIG. 18 is a graph showing current characteristics of the TFT in FIG. 13. The curve in FIG. 13 shows the drain-source currents Ids of the TFT in FIG. 13, as a function of the gate-source voltages Vgs. Here, the TFT is exposed to the light having the luminance of 3,800 cd/m$^2$.

As shown in FIG. 18, a measured current characteristics of the TFT according to the seventh embodiment is good.

What is claimed is:

1. A thin film transistor for a liquid crystal display comprising:

a gate electrode;

an insulator covering the gate electrode;

an amorphous silicon layer formed on the insulator, wherein edges of the amorphous silicon layer are substantially encompassed by edges of the gate electrode and the edges of the amorphous silicon layer are spaced apart from the edges of the gate electrode by at least 2 microns;

a source electrode which is formed on the amorphous silicon layer and overlaps the gate electrode; and a drain electrode which is formed on the amorphous silicon layer and opposite and separated from the source electrode, and overlaps the gate electrode;

wherein the source electrode has an annular shape and wherein the source electrode at least partially surrounds the drain electrode.

2. The thin film transistor as claimed in claim 1, wherein the distance between the edge lines of the gate electrode and the amorphous silicon layer is at least 3.5 microns.

3. The thin film transistor as claimed in claim 1, further comprising a first insulation layer which is separated from the amorphous silicon layer and disposed between the source electrode and edges of the gate electrode.

4. The thin film transistor as claimed in claim 3, further comprising a second insulating layer which is separated from the amorphous silicon layer and disposed between the drain electrode and the edges of the gate electrode.

5. The thin film transistor as claimed in claim 4, wherein the first and the second insulation layers comprise a material which absorbs incident light.

6. The thin film transistor as claimed in claim 5, wherein the first and the second insulation layers are made of amorphous silicon.

7. A thin film transistor for a liquid crystal display, comprising:

a gate electrode;

an insulator covering said gate electrode;

an amorphous silicon layer formed on said insulator;

a drain electrode which is formed on said amorphous silicon layer and overlaps said gate electrode; and a source electrode which is formed *on* said amorphous silicon layer and opposite and separated from said drain electrode, and overlaps said gate electrode;

wherein said amorphous silicon layer covers an edge of said gate electrode that extends opposite said source electrode;

wherein said source electrode has an annular shape and at least partially surrounds said drain electrode; and wherein said amorphous silicon layer covers an edge of said gate electrode which extends opposite said drain electrode.

8. The thin film transistor as claimed in claim 7, wherein edges of the source electrode which are encompassed by edges of the gate electrode are enclosed by edges of the amorphous silicon layer.

9. A thin film transistor for a liquid crystal display, comprising:

a gate electrode;

an insulator covering said gate electrode;

an amorphous silicon layer formed on said insulator;

a drain electrode which is formed on said amorphous silicon layer and overlaps said gate electrode; and a source electrode which is formed on said amorphous silicon layer and opposite and separated from said drain electrode, and overlaps said gate electrode;

wherein said amorphous silicon layer covers an edge of said gate electrode that extends opposite said source electrode and extends along said drain electrode;

wherein said source electrode has an annular shape and at least partially surrounds said drain electrode; and wherein said amorphous silicon layer that extends along said drain electrode lies within a boundary of said drain electrode.

10. A thin film transistor for a liquid crystal display comprising:

a gate electrode;

an insulator covering the gate electrode;

an amorphous silicon layer formed on the insulator, wherein edges of the amorphous silicon layer are substantially encompassed by edges of the gate electrode and the edges of the amorphous silicon layer are spaced apart from the edges of the gate electrode by at least 2 microns;

a source electrode which is formed on the amorphous silicon layer and overlaps the gate electrode; and a drain electrode which is formed on the amorphous silicon layer and opposite and separated from the source electrode, and overlaps the gate electrode;

wherein the source electrode has at least one portion that at least partially surrounds the drain electrode.

11. The thin film transistor as claimed in claim 10, wherein the at least one portion comprises at least one elongated portion.

12. The thin film transistor as claimed in claim 10, wherein the source electrode has more than one elongated portion that at least partially surrounds the drain electrode.

13. A liquid crystal display device, comprising:

a transparent substrate having a surface thereon; and a thin-film transistor on said transparent substrate, said transistor comprising:

a gate electrode that extends on the surface, drain and source electrodes that cross over first and second edges of said gate electrode, respectively, when viewed in a first direction normal to the surface; and an amorphous silicon active layer that is electrically coupled to said source and drain electrodes, said amorphous silicon active layer having a plurality of edges that extend within a perimeter of said gate electrode when viewed in the first direction and at least one edge that crosses the first edge of said gate electrode so that a first tab portion of said amorphous silicon active layer has a width greater than a width of said drain electrode and is spaced between said drain electrode and the first edge of said gate electrode.

14. The device of claim 13, wherein said source electrode has a shape that at least partially surrounds said drain electrode.

15. The device of claim 14, wherein a second tab portion of said amorphous silicon active layer has a width greater than a width of said source electrode and is spaced between said source electrode and the second edge of said gate electrode.

16. The device of claim 14, wherein a second portion of said amorphous silicon active layer is spaced between said source electrode and the second edge of said gate electrode.

17. A liquid crystal display device, comprising:

a transparent substrate having a surface thereon; and a thin-film transistor on said transparent substrate, said transistor comprising:

a gate electrode that extends on the surface;

drain and source electrodes that cross over first and second edges of the gate electrode, respectively, when viewed in a first direction normal to the surface;

an amorphous silicon active layer that is electrically coupled to said source and drain electrodes, said amorphous silicon active layer having a plurality of edges that extend within a perimeter of said gate electrode when viewed in the first direction;

a first amorphous silicon spacer that is disposed between the first edge of said gate electrode and said drain electrode and is electrically isolated from said amorphous silicon active layer; and a second amorphous silicon spacer that is disposed between the second edge of said gate electrode and said source electrode and is electrically isolated from said amorphous silicon active layer.

18. A thin film transistor for a liquid crystal display comprising:

a gate electrode;

an insulator covering the gate electrode;

an amorphous silicon layer formed on the insulator;

a source electrode which is formed on the amorphous silicon layer and overlaps at least a portion of the gate electrode; and a drain electrode which is formed on the amorphous silicon layer and opposite and separated from the source electrode, and overlaps at least a portion of the gate electrode, wherein[,] at least a width of the amorphous silicon layer under the drain electrode is narrower than a width of the drain electrode at an edge of the gate electrode; and wherein the source electrode has an annular shape and wherein the source electrode at least partially surrounds the drain electrode.

19. The thin film transistor as claimed in claim 18, wherein the gate electrode has a bending portion.

*20. A thin film transistor for a liquid crystal display comprising:*

*a gate electrode having first and second edges;*

*an insulator on the gate electrode;*

*a semiconductor layer formed on the insulator;*

*a first electrode formed on the semiconductor layer;*

*a second electrode formed on the semiconductor layer, the second electrode separated from the first electrode and overlapping the first edge of the gate electrode;*

*a first insulation layer laterally separated from the semiconductor layer and interposed between the second electrode and the first edge of the gate electrode; and*

*a second insulation layer separated from the semiconductor layer and interposed between the first electrode and the second edge of the gate electrode.*

*21. The thin film transistor of claim 20, wherein at least a width of the first insulation layer is greater than a width of the second electrode at the first edge of the gate electrode.*

*22. The thin film transistor of claim 20, wherein the first insulation layer extends along the second electrode.*

*23. The thin film transistor of claim 22, wherein the first insulation layer that extends along the second electrode lies within a boundary of the second electrode.*

*24. The thin film transistor of claim 20, wherein the first insulation layer comprises a material which absorbs incident light.*

*25. The thin film transistor of claim 20, wherein the semiconductor layer and the first insulation layer comprises an amorphous silicon layer.*

*26. The thin film transistor of claim 25, further comprising a doped amorphous silicon layer containing impurity on the amorphous silicon layer.*

*27. The thin film transistor of claim 25, wherein the semiconductor layer comprises amorphous silicon.*

*28. The thin film transistor of claim 20, wherein the first electrode overlaps the second edge of the gate electrode.*

*29. The thin film transistor of claim 28, wherein the first and the second insulation layers comprise a material which absorbs incident light.*

*30. The thin film transistor of claim 28, wherein the first and the second insulation layers are made of amorphous silicon.*

*31. The thin film transistor of claim 30, wherein the semiconductor layer comprises amorphous silicon.*

*32. The thin film transistor of claim 20, wherein the first electrode has an annular shape and at least partially surrounds the second electrode.*

*33. The thin film transistor of claim 20, wherein the semiconductor layer covers an edge of the gate electrode overlapping the first electrode.*

*34. The thin film transistor of claim 32, wherein the semiconductor layer extends along the first electrode.*

*35. The thin film transistor of claim 34, wherein the semiconductor layer that extends along the first electrode lies within a boundary of the first electrode.*

*36. The thin film transistor of claim 20, wherein edges of the semiconductor layer are substantially encompassed by edges of the gate electrode.*

*37. The thin film transistor of claim 20, wherein the first and the second electrodes are source and drain electrodes, respectively.*

*38. The thin film transistor of claim 20, wherein the first and the second electrodes are drain and source electrodes, respectively.*

*39. A thin film transistor for a liquid crystal display comprising;*

*a gate electrode;*

*an insulator on the gate electrode;*

*a first semiconductor layer formed on the insulator;*

*a source electrode formed on the first semiconductor layer and overlapping a first edge of the gate electrode;*

*a drain electrode formed on the first semiconductor layer and separate from the source electrode, and overlapping a second edge of the gate electrode;*

*a second semiconductor layer laterally separated from the first semiconductor layer and interposed between the drain electrode and the second edge of the gate electrode; and*

*a third semiconductor layer laterally separated from the first semiconductor layer and interposed between the source electrode and the first edge of the gate electrode.*

*40. The thin film transistor of claim 39, wherein at least a width of the second semiconductor layer is greater than a width of the drain electrode at the second edge of the gate electrode.*

*41. The thin film transistor of claim 39, wherein the second semiconductor layer extends along the drain electrode.*

*42. The thin film transistor of claim 41, wherein the second semiconductor layer that extends along the drain electrode lies within a boundary of the drain electrode.*

*43. The thin film transistor of claim 39, wherein the first and the second semiconductor layers comprise amorphous silicon.*

*44. The thin film transistor of claim 43, further comprising a doped amorphous silicon layer containing impurity on the first and the second semiconductor layers.*

*45. The thin film transistor of claim 39, wherein the source electrode has an annular shape and at least partially surrounds the drain electrode.*

*46. The thin film transistor of claim 39, wherein edges of the first semiconductor layer are substantially encompassed by edges of the gate electrode.*

* * * * *